United States Patent
Abe

(10) Patent No.: US 9,982,366 B2
(45) Date of Patent: May 29, 2018

(54) SINGLE CRYSTAL PRODUCTION APPARATUS

(71) Applicant: TOYOTA JIDOSHA KABUSHIKI KAISHA, Toyota-shi, Aichi-ken (JP)

(72) Inventor: Nobuhira Abe, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 45 days.

(21) Appl. No.: 15/000,883

(22) Filed: Jan. 19, 2016

(65) Prior Publication Data

US 2016/0208410 A1 Jul. 21, 2016

(30) Foreign Application Priority Data

Jan. 19, 2015 (JP) ................................. 2015-007548

(51) Int. Cl.
| | | |
|---|---|---|
| *C30B 29/36* | (2006.01) | |
| *C30B 35/00* | (2006.01) | |
| *C30B 9/06* | (2006.01) | |
| *C30B 15/30* | (2006.01) | |

(52) U.S. Cl.
CPC .............. *C30B 35/00* (2013.01); *C30B 9/06* (2013.01); *C30B 15/30* (2013.01); *C30B 29/36* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,096,677 A | * | 3/1992 | Katsuoka | ................ C30B 15/14 117/202 |
| 5,968,267 A | * | 10/1999 | Li | ........................... C30B 15/00 117/208 |
| 6,228,167 B1 | | 5/2001 | Kuramoto et al. | |
| 6,358,314 B1 | | 3/2002 | Li | |

FOREIGN PATENT DOCUMENTS

| | | |
|---|---|---|
| CN | 202164386 U | 3/2012 |
| JP | H03-199194 A | 8/1991 |
| JP | H03-275587 A | 12/1991 |
| JP | H06-219887 A | 8/1994 |
| JP | H06-219889 A | 8/1994 |
| JP | H11-106281 A | 4/1999 |
| JP | H11-199366 A | 7/1999 |
| JP | 2011-073952 A | 4/2011 |
| JP | 2012-082087 A | 4/2012 |

\* cited by examiner

*Primary Examiner* — Erin F Bergner
(74) *Attorney, Agent, or Firm* — Oliff PLC

(57) ABSTRACT

A single crystal production apparatus including a chamber housing a crucible and a heater, to which at least part of the heater is connected, a strain buffering support member connected to the chamber in a manner capable of being horizontally displaced while supporting the chamber in the perpendicular direction, and a base member to which a crucible support shaft and a seed crystal support shaft are directly connected and the chamber is connected via the strain buffering support member, wherein the rigidity of the base member is larger than the rigidity of the strain buffering support member, the chamber has a through hole, the crucible support shaft and the seed crystal support shaft are inserted into the through hole, and the gap between the crucible support shaft and the through hole and the gap between the seed crystal support shaft and the through hole are sealed by a sealing member.

10 Claims, 1 Drawing Sheet

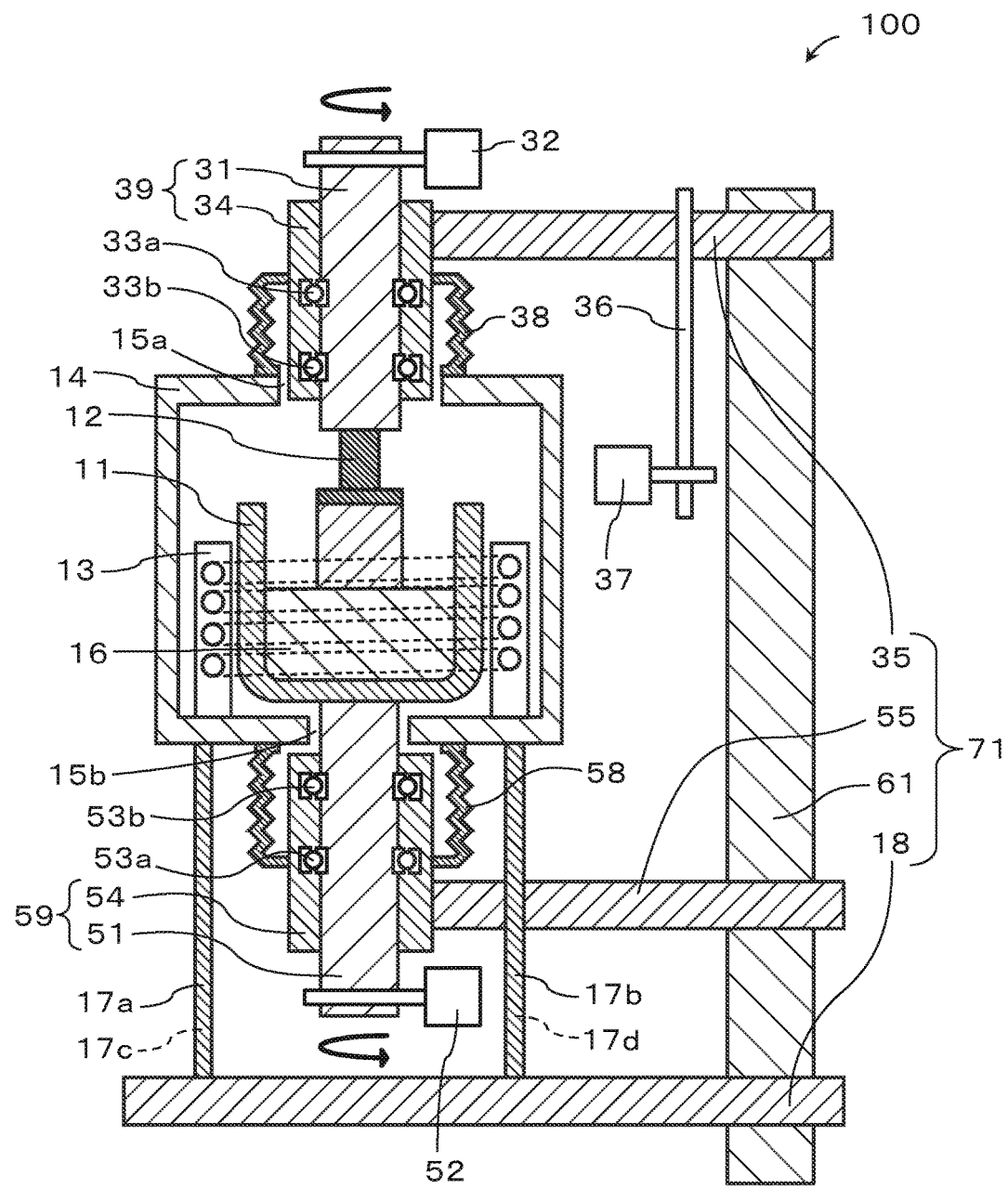

SINGLE CRYSTAL PRODUCTION APPARATUS

TECHNICAL FIELD

The present invention relates to a single crystal production apparatus. More specifically, the present invention relates to an apparatus for producing a SiC single crystal by a solution method.

BACKGROUND ART

As the method for producing a single crystal, there is a method where a seed crystal is dipped in a raw material solution in a crucible disposed inside a chamber and pulled up.

As the production method of a SiC (silicon carbide) single crystal, a solution method is known. In the solution method, raw material Si (silicon) is charged into a graphite crucible provided inside a chamber, and the raw material is melted by a heater to form a Si solution. C is dissolved out from the graphite crucible into the Si solution above to form a Si—C solution, and a seed crystal is dipped in the Si—C solution and pulled up, whereby a single crystal is produced.

Patent Document 1 discloses a method for producing a Si single crystal in a chamber by the Czochralski method.

RELATED ART

Patent Document

[Patent Document 1] Japanese Unexamined Patent Publication No. 2011-073952

SUMMARY OF THE INVENTION

Problems to be Solved by the Invention

In the case of producing a Si single crystal, the quantity of radiant heat to which the chamber is exposed is not so large, because the temperature of a Si solution is not made very high.

However, in the case of producing a SiC single crystal, in order to dissolve out C of a graphite crucible into a Si solution to form a Si—C solution, the temperature of the Si solution needs to be made very high, and therefore the quantity of radiant heat to which the chamber is exposed is greatly large. Due to the radiant heat, a strain is generated in the chamber, and the strain propagates via a seed crystal support shaft and a crucible support shaft and deteriorates the quality of a single crystal.

An object of the present invention is to provide a single crystal production apparatus capable of solving the above-described problems.

Means to Solve the Problems

The gist of the present invention is as follows.
<1> A single crystal production apparatus including;
a crucible,
a heater surrounding the periphery of the crucible,
a crucible support shaft connected to the bottom of the crucible,
a seed crystal support shaft facing the crucible,
a chamber housing the crucible and the heater, to which at least part of the heater is connected,
a strain buffering support member connected to the chamber in a manner capable of being horizontally displaced while supporting the chamber in the perpendicular direction, and
a base member to which the crucible support shaft and the seed crystal support shaft are directly connected and the chamber is connected via the strain buffering support member,
wherein
the rigidity of the base member is larger than the rigidity of the strain buffering support member,
the chamber has a through hole,
the crucible support shaft and the seed crystal support shaft are inserted into the through hole, and
the gap between the crucible support shaft and the through hole and the gap between the seed crystal support shaft and the through hole are sealed by a sealing member.
<2> The apparatus according to item <1>, wherein the crucible support shaft is a crucible rotating part having a crucible rotating shaft and a housing member disposed via a bearing on the outer circumference of the crucible rotating shaft.
<3> The apparatus according to item <1> or <2>, wherein the seed crystal support shaft is a seed crystal rotating part having a seed crystal rotating shaft and a housing member disposed via a bearing on the outer circumference of the seed crystal rotating shaft.
<4> The apparatus according to any one of <1> to <3>, wherein the sealing member is a bellows.

Effects of the Invention

According to the present invention, strain of a chamber due to radiant heat from a heat source inside the chamber is not propagated to a crucible support shaft and a seed crystal support shaft, so that a single crystal production apparatus capable of enhancing the quality of a single crystal can be provided.

BRIEF DESCRIPTION OF THE DRAWINGS

FIG. 1 A view illustrating an example of the outline of the single crystal production apparatus of the present invention.

MODE FOR CARRYING OUT THE INVENTION

The embodiment of the single crystal production apparatus according to the present invention is described below by referring to the drawings. The present invention is not limited to the following embodiment. For example, as described above, the present invention is, among others, suitably used as a SiC single crystal production apparatus where the temperature of a solution in a crucible becomes very high, but the present invention may of course be used as a Si single crystal production apparatus where the temperature of a solution in a crucible does not become so high.

FIG. 1 is a view illustrating an example of the outline of the single crystal production apparatus of the present invention.

In the single crystal production apparatus 100 of the present invention, a crucible 11, a seed crystal 12 and a heater 13 are housed in a chamber 14. The heater 13 is disposed to surround the periphery of the crucible 11. At least part of the heater 13 is connected to the chamber 14. In the embodiment illustrated in FIG. 1, the bottom face of the heater 13 is connected to the inner side of the bottom of the chamber 14. The connection position of the heater 13 to the chamber 14 is not particularly limited as long as the heater 13 is fixed to the chamber 14. In addition, the heater 13 is not particularly limited but is generally an induction heating coil or a resistance heating heater.

The chamber 14 is connected to a vacuum pump (not illustrated). The inside of the chamber 14 is evacuated by the vacuum pump so as to preclude mixing of even a slight amount of oxygen, and an inert gas such as helium is introduced from an inert gas supply source (not illustrated) to create a positive pressure in the chamber 14. In this state, the raw material is heated and melted by the heater 13 to form a raw material solution 16. A seed crystal 12 is dipped in the raw material solution 16, and the seed crystal 12 is pulled up.

The raw material solution 16 is not particularly limited, but the present invention is particularly useful when the temperature of a Si—C solution as the raw material solution 16 is made very high as in the case of producing a SiC single crystal.

The chamber 14 has through holes 15a and 15b. The action and effect of the through holes 15a and 15b are described later.

The chamber 14 is connected to a first base member 18 via strain buffering support members 17a, 17b, 17c and 17d. In FIG. 1, the stain buffering support members 17c and 17d are respectively present at positions hidden from view by the strain buffering support members 17a and 17b. The first base member 18 is connected to a fourth base member 61 together with a second base member 35 and a third base member 55 to constitute a base member 71.

The chamber 14 is exposed to radiant heat from the raw material solution 16, and due to this radiant heat, a strain is generated in the chamber 14. In the case where the raw material solution 16 is, for example, a Si—C solution and the temperature thereof is very high, the strain generated in the chamber 14 is particularly large.

In the embodiment illustrated in FIG. 1, the strain buffering support member consists of four strain buffering support members 17a, 17b, 17c and 17d. The strain buffering support members 17a, 17b, 17c and 17d are not limited in the number of members, shape and material as long as they can support the weight of the chamber 14, contents thereof and heater (hereinafter, sometimes referred to as "weight of chamber 14, etc.") in the perpendicular direction and when exposed to strain generated in the chamber 14, can be displaced in the horizontal direction to buffer the strain and allow no propagation of the strain to the first base member 18. In addition, in the embodiment illustrated in FIG. 1, the first base member 18 consists of one member, but the first base member 18 is not limited in the number of members, shape and material as long as it can support the chamber 14 without bending.

The base member 71 consisting of the first base member 18, the second base member 35, the third base member 55 and the fourth base member 61 is a member supporting the whole single crystal production apparatus 100, and the rigidity of the base member 71 is larger than the rigidity of the strain buffering support members 17a, 17b, 17c and 17d. That is, even when the strain buffering support members 17a, 17b, 17c and 17d are bent in the horizontal direction so as to buffer the strain generated in the chamber 14, the bending is not propagated to the base member 71.

The rigidity of the base member is larger than the rigidity of the stain buffering support member, and this means the base member 71 is less deformed in a horizontal direction compared to the strain buffering support members 17a, 17b, 17c and 17d when the chamber 14 is deformed. Alternatively, the rigidity of the base member is greater than the rigidity of the buffering support member, and therefore the second moment of area of the base member is greater than the second moment of area of the support member. The second moment of area of the base member is the second moment of area of the entire base member. In the embodiment illustrated in FIG. 1, the second moment of area of the base member means the second moment of area of the entire base member which comprises the first base member 18, the second base member 35, the third base member 55, and the fourth base member 61. In the case where the base member 71 has additional member, for example ribs, the second moment of area of the base member is the second moment of area of the base member having the additional member. On the other hand, the rigidity of the buffering support member is the sum of the rigidity of each buffering support members. In the embodiment illustrated in FIG. 1, the rigidity of the buffering support member is the sum of the rigidity of four buffering support members 17a, 17b, 17c, 17d. In case of five buffering support members, the rigidity of the buffering support member is the sum of the rigidity of five buffering support members.

The connection positions of the strain buffering support members 17a, 17b, 17c and 17d are not particularly limited as long as each of the strain buffering support members 17a, 17b, 17c and 17d is connected between the chamber 14 and the first base member 18.

In the embodiment illustrated in FIG. 1, each of the strain buffering support members 17a, 17b, 17c and 17d is connected between the bottom face of the chamber 14 and the first base member 18. More specifically, one end of each of the strain buffering support members 17a, 17b, 17c and 17d is connected to the bottom face of the chamber 14, and another end is connected to the first base member 18. The strain buffering support members 17a, 17b, 17c and 17d are bent/displaced in the horizontal direction while supporting the weight of the chamber 14, etc. and thereby buffer the strain generated in the chamber 14.

It may also be possible that the first base member 18 is disposed above the chamber 14 and each of the strain buffering support members 17a, 17b, 17c and 17d is connected between the top face of the chamber 14 and the later-described second base member 35. More specifically, one end of each of the strain buffering support members 17a, 17b, 17c and 17d is connected to the top face of the chamber 14, and another end is connected to the second base member 35. The strain buffering support members 17a, 17b, 17c and 17d are displaced in the horizontal direction while keeping the chamber 14 suspended without falling down, whereby the strain generated in the chamber 14 is reduced.

The seed crystal 12 is connected to a seed crystal rotating shaft 31. Since the seed crystal 12 is dipped in the raw material solution 16 inside the crucible 11, the seed crystal rotating shaft 31 faces the crucible 11. A rotation source 32 is connected to the seed crystal rotating shaft 31. The rotation source 32 is not particularly limited as long as it can rotate the seed crystal rotating shaft 31, but an electric motor is generally used.

A housing member 34 is disposed via bearings 33a and 33b on the outer circumference of the seed crystal rotating shaft 31. The seed crystal rotating shaft 31, the bearings 33a and 33b, and the housing member 34 constitute a seed crystal rotating part 39. In the embodiment illustrated in FIG. 1, both ends of the seed crystal rotating shaft 31 protrude from the housing member 34, but the present invention is not limited thereto. In another embodiment, it may also be possible, for example, that the end on the seed crystal 12 side of the seed crystal rotating shaft 31 is not protruded from the housing member 34, the seed crystal 12 is extended to the seed crystal rotating shaft 31 side, and the seed crystal 12 is connected to the seed crystal rotating shaft 31.

The second support member 35 is directly connected to the housing member 34. In the embodiment illustrated in FIG. 1, the second support member 35 consists of one member but is not limited in the material, shape and material as long as it is not bent. In addition, the fourth base member 61 is connected to the second base member 35. The first base member 18, the second base member 55, the third base member 55 and the fourth base member 61 constitute the base member 71.

In the embodiment illustrated in FIG. 1, the seed crystal rotating part 39 is rotated, but the seed crystal rotating part 39 may be replaced by a non-rotary seed crystal support shaft.

A hoisting member is connected to the second base member 35. In the embodiment illustrated in FIG. 1, a ball screw 36 is connected to the second base member 35, and an electric motor 37 is connected to the ball screw 36, but the present invention is not limited thereto. The ball screw 36 is rotated by the electric motor 37 to hoist the second support member 35, whereby the seed crystal 12 is pulled up.

At least either one of the seed crystal rotating shaft 31 and the housing member 34 is retractably disposed while being kept from contacting with the inner circumference of the through hole 15a.

In the case of the embodiment illustrated in FIG. 1, the inner diameter of the through hole 15a is larger than the outer diameter of the housing member 34, so that both the seed crystal rotating shaft 31 and the housing member 34 can be advanced or retreated without coming into contact with the inner circumference of the through hole 15a. In the case where the inner diameter of the through hole 15a is larger than the outer diameter of the seed crystal rotating shaft 31 and smaller than the outer diameter of the housing member 34, only the seed crystal rotating shaft 31 can be advanced or retreated without coming into contact with the inner circumference of the through hole 15a.

In either case, the seed crystal rotating shaft 31 and the housing member 34 are not put into contact with the chamber 14, and therefore strain generated in the chamber 14 is not propagated to the seed crystal rotating shaft 31. More specifically, since the seed crystal rotating part 39 is inserted into the through hole 15a, strain generated in the chamber 14 is not propagated to the seed crystal rotating part 39. The same is true also in the case where the seed crystal rotating part 39 is a non-rotary seed crystal support shaft.

In order to maintain the airtightness inside the chamber 14, the gap between the outer circumference of the housing member 34 and the through hole 15a is sealed by a sealing member 38. In the embodiment illustrated in FIG. 1, one end of the sealing member 38 is connected to the outer circumference of the housing member 34, and another end of the sealing member 38 is connected to the outer edge part of the through hole 15a. The sealing member 38 is not particularly limited as long as it seals the gap and expands/contracts following ascending/descending of the housing member 34. Since the sealing member 38 seals only the above-described gap and has stretchability, strain generated in the chamber 14 is not propagated by the sealing member 38 to the housing member 34. Also for this reason, even when the housing member 34, namely, the seed crystal rotating part 39, is directly connected to the second connection member 35, the strain from the chamber 14 is not propagated. The same is true also in the case where the seed crystal rotating part 39 is a non-rotary seed crystal support shaft.

In the single crystal production apparatus 100 of the present invention, a gap is present between the through hole 15a and the housing member 34. Accordingly, in the present invention, while this gap is provided, the sealing member 38 incapable of propagating strain is disposed to seal the inside of the chamber 14. More specifically, the seed crystal rotating part 39 is disposed independently from the chamber 14 without impairing the hermeticity inside the chamber 14. The same is true also in the case where the seed crystal rotating part 39 is a non-rotary seed crystal support shaft.

The sealing member 38 is exposed to radiant heat from the inside of the chamber 14, and therefore is preferably heat-resistant. In addition, from the standpoint of good storability at the time of contraction, a bellows is preferred, but the present invention is not limited thereto.

A crucible rotating shaft 51 is connected to the bottom of the crucible 11. A rotation source 52 is connected to the crucible rotating shaft 51. The rotation source 52 is not particularly limited as long as it can rotate the crucible rotating shaft 51, but an electric motor is generally used.

A housing member 54 is disposed via bearings 53a and 53b on the outer circumference of the crucible rotating shaft 51. The crucible rotating shaft 51, the bearings 53a and 53b, and the housing member 54 constitute a crucible rotating part 59. In the embodiment illustrated in FIG. 1, both ends of the crucible rotating shaft 51 protrude from the housing member 54, but the present invention is not limited thereto. In another embodiment, it may also be possible, for example, that the end on the crucible 11 side of the crucible rotating shaft 51 is not protruded from the housing member 54, an auxiliary rod is disposed on the bottom of the crucible 11, and the crucible 11 is connected to the crucible rotating shaft 51 via the auxiliary rod.

The third base member 55 is connected to the housing member 54. In the embodiment illustrated in FIG. 1, the third base member 55 consists of one member but is not limited in the number of members, shape and material as long as it is not bent. In addition, the third base member 55 is connected to the fourth base member 61. The first base member 18, the second base member 35, the third base member 55 and the fourth base member 61 constitute the base member 71.

At least either one of the crucible rotating shaft 51 and the housing member 54 is retractably disposed while being kept from contacting with the inner circumference of the through hole 15b.

In the case of the embodiment illustrated in FIG. 1, the inner diameter of the through hole 15b is larger than the outer diameter of the crucible rotating shaft 51 and smaller than the outer diameter of the housing member 54, and therefore only the crucible rotating shaft 51 can be advanced or retreated without coming into contact with the inner circumference of the through hole 15b. In another embodiment, the inner diameter of the through hole 15b is larger than the outer diameter of the housing member 54 and in this case, both the crucible rotating shaft 51 and the housing member 54 can be advanced or retreated without coming into contact with the inner circumference of the through hole 15b.

In either case, the crucible rotating shaft 51 and the housing member 54 are not put into contact with the chamber 14, and therefore strain generated in the chamber 14 is not propagated to the crucible rotating shaft 51. More specifically, since the crucible rotating part 59 is inserted into the through hole 15b, strain generated in the chamber 14 is not propagated to the crucible rotating part 59. The same is true also in the case where the crucible rotating part 59 is one non-rotary crucible support shaft.

In order to maintain the airtightness inside the chamber 14, the gap between the outer circumference of the crucible rotating shaft 51 and the through hole 15b is sealed by a sealing member 58. In the embodiment illustrated in FIG. 1, one end of the sealing member 58 is connected to the outer circumference of the housing member 54, and another end of the sealing member 58 is connected to the outer edge part of the through hole 15b. The sealing member 58 is not particularly limited as long as it seals the gap above. The housing member is usually not moved up or down, but in case it is moved up or down by adjustment, etc., the member is preferably stretchable. Since the sealing member 58 seals only the above-described gap and has stretchability, strain generated in the chamber 14 is not propagated by the sealing member 58 to the housing member 54. For this reason, even when the housing member 54, namely, the crucible rotating part 59, is directly connected to the third connection member 55, the strain from the chamber 14 is not propagated. The same is true also in the case where the crucible rotating part 59 is a non-rotary crucible support shaft.

In the single crystal production apparatus 100 of the present invention, a gap is present between the through hole 15b and the crucible rotating shaft 51. Accordingly, in the present invention, while this gap is provided, the sealing member 58 incapable of propagating strain is disposed to seal the inside of the chamber 14. More specifically, the crucible rotating part 59 is disposed independently from the chamber 14 without impairing the hermeticity inside the chamber 14. The same is true also in the case where the crucible rotating part 59 is a non-rotary crucible support shaft.

The sealing member 58 is exposed to radiant heat from the inside of the chamber 14, and therefore is preferably heat-resistant. In addition, from the standpoint of good storability at the time of contraction, a bellows is preferred, but the present invention is not limited thereto.

In this embodiment, an embodiment where both the seed crystal 12 and the crucible 11 are rotated, is described, but either one of the seed crystal 12 and the crucible 11 may be rotated. In addition, as described above, both the seed crystal 12 and the crucible 11 may not be rotated, and the seed crystal rotating part 39 and the crucible rotating part 59 may be replaced by a seed crystal support shaft and a crucible support shaft, respectively.

In the single crystal production apparatus 100 of the present invention, the seed crystal rotating part 39 is kept from contacting with the through hole 15a, and the crucible rotating part 59 is kept from contacting with the through hole 15b. In addition, since the sealing members 38 and 58 seal only the chamber 14, strain generated in the chamber 14 is not propagated to the base member 71 from the seed crystal rotating part 39 and the crucible rotating part 59. Furthermore, strain generated in the chamber 14 is buffered by the stain buffering support members 17a, 17b, 17c and 17d. Therefore, stain generated in the chamber 14 is not propagated to the seed crystal rotating part 39 and the crucible rotating part 59, via the first base member 18, the second base member 35, the third base member 55, and the fourth base member 61. Accordingly, the first base member 18, the second base member 35, the third base member 55, and the fourth base member 61 may integrally form the base member 71. The same is true also in the case where the seed crystal rotating part 39 and the crucible rotating part 59 are not rotated and are a seed crystal support shaft and a crucible support shaft.

INDUSTRIAL APPLICABILITY

According to the present invention, the strain in a chamber due to radiant heat from a heat source inside the chamber does not propagate to a crystal support shaft and a crucible support shaft, so that the quality of a single crystal can be enhanced. Hence, there is great industrial applicability in the present invention.

DESCRIPTION OF NUMERICAL REFERENCES

11 Crucible
12 Seed crystal
13 Heater
14 Chamber
15a, 15b Through hole
16 Raw material solution
17a, 17b, 17c, 17d Strain buffering support member
18 First base member
31 Seed crystal rotating shaft
32, 52 Rotation source
33a, 33b, 53a, 53b Bearing
34, 54 Housing member
35 Second base member
36 Ball screw
37 Electric motor
38, 58 Sealing member
39 Seed crystal rotating part (seed crystal support shaft)
51 Crucible rotating shaft
55 Third base member
59 Crucible rotating part (crucible support shaft)
61 Fourth base member
71 Base member
100 Single crystal production apparatus

The invention claimed is:

1. A single crystal production apparatus comprising:
   a crucible,
   a heater surrounding the periphery of said crucible,
   a crucible support shaft connected to the bottom of said crucible,
   a seed crystal support shaft facing said crucible,
   a chamber housing said crucible and said heater, to which at least part of said heater is connected,
   a strain buffering support member connected to said chamber in a manner capable of being horizontally displaced while supporting said chamber in the perpendicular direction, and
   a base member to which said crucible support shaft and said seed crystal support shaft are directly connected and said chamber is only supported on the base member via said strain buffering support member,
   wherein
      the rigidity of said base member is larger than the rigidity of said strain buffering support member,
      said chamber has a through hole,
      said crucible support shaft and said seed crystal support shaft are inserted into said through hole, and
      the gap between said crucible support shaft and said through hole is sealed by a sealing member and the gap between said seed crystal support shaft and said through hole is sealed by another sealing member.

2. The apparatus according to claim 1, wherein said crucible support shaft is a crucible rotating part having a crucible rotating shaft and a housing member disposed via a bearing on the outer circumference of said crucible rotating shaft.

3. The apparatus according to claim 1, wherein said seed crystal support shaft is a seed crystal rotating part having a seed crystal rotating shaft and a housing member disposed via a bearing on the outer circumference of said seed crystal rotating shaft.

4. The apparatus according to claim 1, wherein at least one of said sealing members is a bellows.

5. The apparatus according to claim 2, wherein said seed crystal support shaft is a seed crystal rotating part having a seed crystal rotating shaft and a housing member disposed via a bearing on the outer circumference of said seed crystal rotating shaft.

6. The apparatus according to claim 2, wherein at least one of said sealing members is a bellows.

7. The apparatus according to claim 3, wherein at least one of said sealing members is a bellows.

8. The apparatus according to claim 5, wherein at least one of said sealing members is a bellows.

9. The apparatus according to claim 1, wherein the base member comprises a first horizontal support member that is directly connected to the crucible support shaft, and a second horizontal support member that is connected to the chamber only via the strain buffering support member.

10. The apparatus according to claim 1, wherein the chamber is connected to the crucible support shaft and the seed crystal support shaft only via the sealing members.

\* \* \* \* \*